US009360725B2

(12) United States Patent
Chung et al.

(10) Patent No.: US 9,360,725 B2
(45) Date of Patent: Jun. 7, 2016

(54) LIQUID-CRYSTAL DISPLAY AND ELEMENT SUBSTRATE THEREOF

(71) Applicant: INNOLUX CORPORATION, Chu-Nan (TW)

(72) Inventors: Yueh-Ting Chung, Chu-Nan (TW); Jyun-Yu Chen, Chu-Nan (TW); Wei-Chen Hsu, Chu-Nan (TW); Yung-Hsin Lu, Chu-Nan (TW); Chao Hsiang Wang, Chu-Nan (TW); Kuan Yu Chiu, Chu-Nan (TW)

(73) Assignee: INNOLUX CORPORATION, Jhu-Nan (TW)

( * ) Notice: Subject to any disclaimer, the term of this patent is extended or adjusted under 35 U.S.C. 154(b) by 0 days.

(21) Appl. No.: 14/493,173

(22) Filed: Sep. 22, 2014

(65) Prior Publication Data

US 2016/0018687 A1 Jan. 21, 2016

(30) Foreign Application Priority Data

Jul. 17, 2014 (TW) ............................. 103124494 A

(51) Int. Cl.
*G02F 1/136* (2006.01)
*G02F 1/1362* (2006.01)
*G02F 1/1343* (2006.01)
*H01L 27/12* (2006.01)
*G02F 1/1333* (2006.01)

(52) U.S. Cl.
CPC ........ *G02F 1/136227* (2013.01); *G02F 1/1343* (2013.01); *G02F 1/1362* (2013.01); *H01L 27/124* (2013.01); *H01L 27/1222* (2013.01); *H01L 27/1225* (2013.01); *G02F 2001/133357* (2013.01)

(58) Field of Classification Search
CPC ............ G02F 1/1368; G02F 1/136227; G02F 1/136286; G02F 1/1345; G02F 1/1362; G02F 1/1343; G02F 2001/133357; H01L 27/124; H01L 27/1222; H01L 27/1225
See application file for complete search history.

(56) References Cited

U.S. PATENT DOCUMENTS 6,136,624 A * 10/2000 Kemmochi ....... G02F 1/136227 257/E21.259
6,147,722 A * 11/2000 Shimada ........... G02F 1/136227 349/123
2003/0209709 A1* 11/2003 Tanabe .............. G02F 1/136227 257/59
2005/0179849 A1* 8/2005 Nomura ................ G02F 1/1345 349/149
2010/0321283 A1* 12/2010 Mizuno ............. G02F 1/136227 345/88
2011/0141425 A1* 6/2011 Moriya ............... G02F 1/13394 349/143
2012/0068200 A1* 3/2012 Oh .................... G02F 1/136227 257/88
2013/0299830 A1* 11/2013 Ishigaki .................. H01L 33/08 257/59
2015/0116623 A1* 4/2015 Tomioka ............... G02F 1/1368 349/43
2015/0124190 A1* 5/2015 Komatsu ........... G02F 1/134309 349/46
2015/0138476 A1* 5/2015 Hyodo .............. G02F 1/136227 349/43
2015/0268526 A1* 9/2015 Kakinuma ........ G02F 1/136227 257/72

* cited by examiner

*Primary Examiner* — Anne Hines
*Assistant Examiner* — Jose M Diaz
(74) *Attorney, Agent, or Firm* — Liu & Liu

(57) ABSTRACT

An element substrate is provided, including a substrate, a metal layer and a planarization layer. The metal layer is located on the substrate. The metal layer has a first edge in a first direction. The planarization layer is located on the metal layer. The planarization layer includes a contact hole. The contact hole has a contiguous wall and a bottom side. The metal layer is exposed in the bottom side. A contour line of the contiguous wall on a vertical plane is a curved line. The first edge corresponds vertically with a critical point on the contour line. The slope of a tangent line on the critical point of the contour line is smaller than 0.176.

18 Claims, 7 Drawing Sheets

LIQUID-CRYSTAL DISPLAY AND ELEMENT SUBSTRATE THEREOF

CROSS REFERENCE TO RELATED APPLICATIONS

This Application claims priority of Taiwan Patent Application No. 103124494, filed on Jul. 17, 2014, the entirety of which is incorporated by reference herein.

BACKGROUND OF THE INVENTION

1. Field of the Invention

The present invention relates to a liquid-crystal display, and in particular to a liquid-crystal display having at least one contact hole.

2. Description of the Related Art

In a liquid-crystal display, a contact hole is utilized to conduct a pixel electrode and a source electrode. However, with reference to FIG. 1, the liquid-crystal molecules 2 are arranged along a profile of the contact hole 1. The contact hole 1 is like a funnel structure, and light leakage happens due to the liquid-crystal molecules 2 arranged along the profile of the contact hole 1, and the contrast of the liquid-crystal display is decreased.

With reference to FIG. 1, conventionally, an area of the source electrode 3 at the bottom the contact hole 1 is increased to cover the light-leaking liquid-crystal molecules 2, and to improve the contrast of the liquid-crystal display. However, this method decreases the aperture ratio and the illumination of the liquid-crystal display, and an improved solution is required.

BRIEF SUMMARY OF THE INVENTION

In one embodiment of the invention, an element substrate is provided, which includes a substrate, a metal layer and a planarization layer. The metal layer is disposed on the substrate, wherein the metal layer has a first width along a first direction. The planarization layer is located on the metal layer, wherein the planarization layer comprises a contact hole, the contact hole has a contiguous wall and a bottom, the bottom exposes the metal layer, and the bottom of the contact hole has a second width along the first direction, wherein the first width and the second width satisfy the following equation:

$$2*\left\{\frac{L_2}{2}+\frac{(1-p)h}{\ln(p)\cdot\tan(1.5\theta)}\cdot\ln\left[\frac{-0.176*(1-p)}{\ln(p)\cdot\tan(1.5\theta)}\right]\right\}-1.8\leq L_1\leq 2*\left\{\frac{L_2}{2}+\frac{(1-p)h}{\ln(p)\cdot\tan(1.5\theta)}\cdot\ln\left[\frac{-0.176*(1-p)}{\ln(p)\cdot\tan(1.5\theta)}\right]\right\}+1.8$$

wherein $L_1$ is the first width along the first direction, and $L_2$ is the second width along the first direction, h is a thickness of the planarization layer, and θ is an included angle between a straight line and a extension surface of the bottom, and the straight line connects a reference point and a base point, and the reference point and the base point are located on the contiguous wall, wherein the vertical distance from the reference point to the substrate is 0.95 h. The base point is located at the point where the contiguous wall is connected to the bottom, p is an adjustable parameter, and (1−p)h is the height of the reference point in a vertical direction, and $0<p\leq 0.1$.

Utilizing the embodiment of the invention, the aperture ratio and the light transmittance (the contrast in dark state) of the liquid-crystal display are optimized, and the light leakage and the low-contrast problem are prevented.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
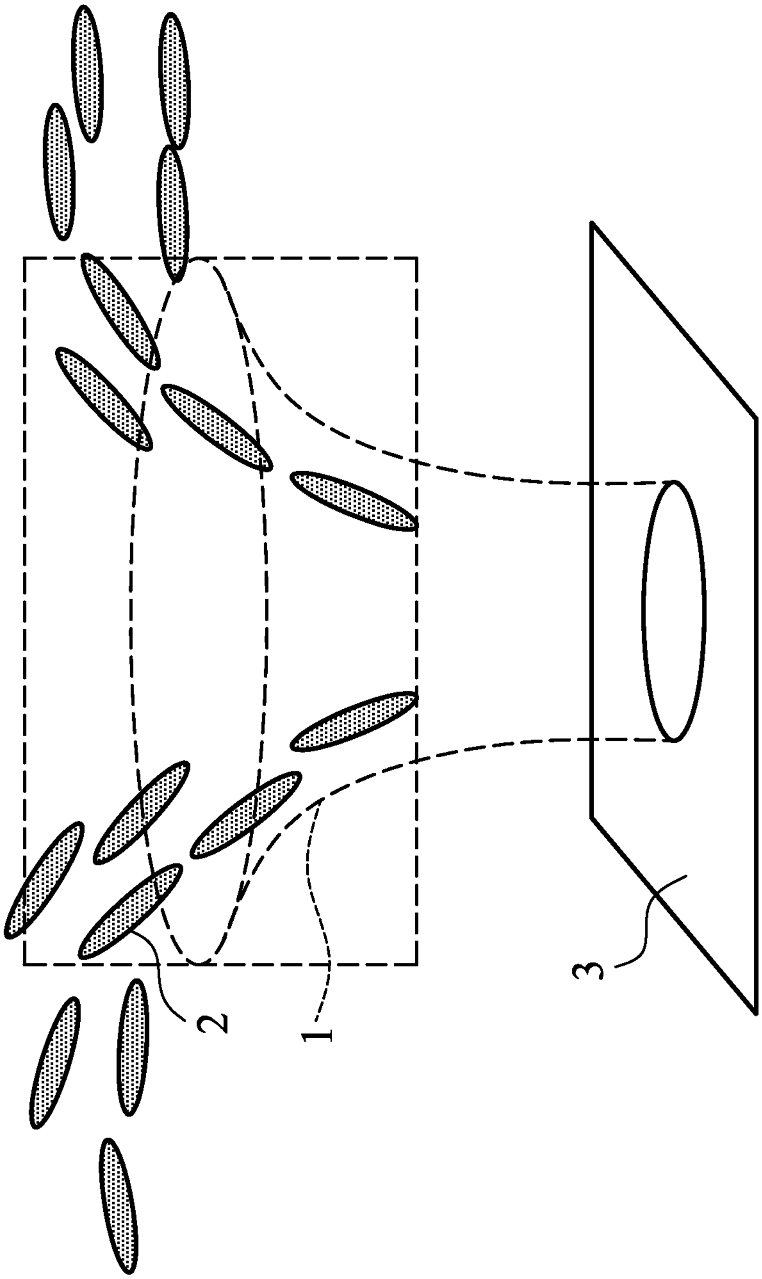
FIG. 1 shows an element substrate of a conventional liquid-crystal display.
Figure 2:
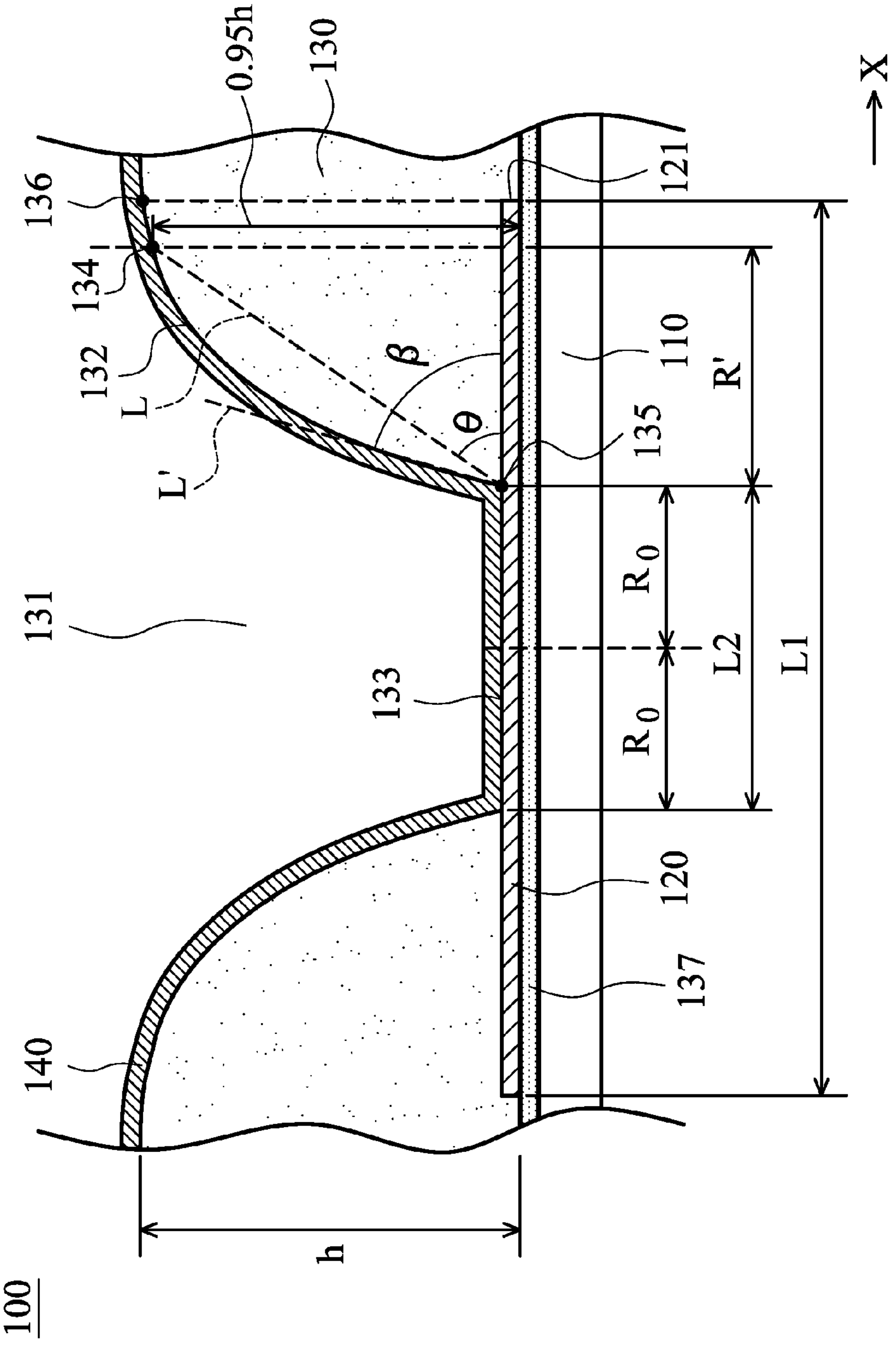
FIG. 2 shows an element substrate of an embodiment of the invention.

FIG. 2 shows an element substrate 100 of an embodiment of the invention, which comprises a substrate 110, a metal layer 120 and a planarization layer 130. The metal layer 120 is disposed on the substrate 110, wherein the metal layer 120 has a first width L1 along a first direction X. The planarization layer 130 is located on the metal layer 120, wherein the planarization layer 130 comprises a contact hole 131, the contact hole 131 has a contiguous wall 132 and a bottom 133, the bottom 133 exposes the metal layer 120, and the bottom 133 of the contact hole 131 has a second width L2 along the first direction X.

The applicant has discovered that the liquid-crystal molecules are arranged along the contiguous wall 132, and the light transmittance (the contrast in dark state) is changed with the slope of the contiguous wall 132. At the location where the tangent slope of the contiguous wall 132 is about tan 10°, light leakage is acceptable, and the contrast of the liquid-crystal display is qualified. When the edge of the metal layer 120 extends to the critical point 136 (where the tangent slope of the contiguous wall 132 is about tan 10°), the aperture ratio and the light transmittance (the contrast in dark state) are optimized.

With reference to FIG. 2, the applicant has discovered from deriving curve equations that when the first width and the second width satisfy the following equation, the aperture ratio and the light transmittance (the contrast in dark state) are optimized:

$$2*\left\{\frac{L_2}{2}+\frac{0.95h}{\ln(0.05)\cdot\tan(1.5\theta)}\cdot\ln\left[\frac{-0.1672}{\ln(0.05)\cdot\tan(1.5\theta)}\right]\right\}-1.8\le L_1\le 2*\left\{\frac{L_2}{2}+\frac{0.95h}{\ln(0.05)\cdot\tan(1.5\theta)}\cdot\ln\left[\frac{-0.1672}{\ln(0.05)\cdot\tan(1.5\theta)}\right]\right\}+1.8$$

wherein $L_1$ is the first width of the metal layer 120 along the first direction X, and $L_2$ is the second width of the bottom 133 of the contact hole 131 along the first direction X, h is the thickness of the planarization layer 130, θ is an included angle between a straight line L and a extension surface of the bottom 133. The straight line L connects a reference point 134 and a base point 135, the reference point 134 and the base point 135 are located on the contiguous wall 132, wherein the vertical distance from the reference point 134 to the substrate is 0.95 h. The base point 135 is located at the point where the contiguous wall 132 is connected to the bottom 133, and ±1.8 is the tolerance. By modifying the parameters above, the curvature and the shape of the contiguous wall 132 can be modified.

With reference to FIG. 2, the derivative of the curve equation is presented in the following description.

First, curve fitting (assuming), assuming a curve equation of the contiguous wall of the contact hole is:

$$y=f(x)=-A'\exp(-x) \tag{1}$$

In equation (1), only asymptotes of the contiguous wall are defined, and the equation (1) must be regulated relative to X axis and Y axis.

Next, the curve fitting (relative to reference point 134, base point 135 and included angle θ), assuming that a distance between the reference point 134 and the top of the planarization layer 130 is p times of the thickness h of the planarization layer 130, and satisfies equation f(R'), and the horizontal distance between the reference point 134 and the base point 135 is R', then:

$$f(R')=-ph=-h\exp\left(\frac{-R'}{\alpha}\right)$$

$$\Rightarrow \alpha=\frac{-R'}{\ln(p)}; \tag{1}$$

$$p>0,\ h>0,\ R'>0 \tag{2}$$

Correction parameter α is achieved.

Next, a straight line L connects the reference point 134 and the base point 135, and an included angle between a straight line and the horizontal line is θ, then:

$$\tan\theta=\frac{(1-p)h}{R'}$$

$$\Rightarrow R'=\frac{(1-p)h}{\tan\theta} \tag{3}$$

Material property θ is brought in.

Next, the vertical distance between the reference point and the substrate is 0.95 h. By combining equations of equation (2) and equation (3), we get:

$$\alpha=\frac{-R'}{\ln(0.05)}=\frac{-0.95h}{\ln(0.05)\cdot\tan\theta} \tag{4}$$

Correction parameter α is achieved.

Next, the included angle β between a cut line L' at base point 135 and the horizontal line defines the angle of the curve of the planarization layer 130, and included angle β substantially equals 1.5θ. Therefore, by revising the curve equation (angle revising) further, we get:

$$f(R')=-h\cdot\exp\{-R'/\alpha\}=-h\cdot\exp\left\{R'\cdot\frac{\ln(0.05)\cdot\tan\beta}{0.95h}\right\}=-h\cdot\exp\left\{R'\cdot\frac{\ln(0.05)\cdot\tan(1.5\theta)}{0.95h}\right\} \tag{5}$$

Curve equation of the contact hole is achieved.

Next, $R=R_0+R'$, by bringing this equation into the above equation, we get:

$$\because R'=R-R_0\ldots\text{(shiftting)}$$

$$\Rightarrow f(R')=-h\cdot\exp\{-(R-R_0)/\alpha\}=-h\cdot\exp\left\{(R-R_0)\cdot\frac{\ln(0.05)\cdot\tan(1.5\theta)}{0.95h}\right\} \tag{6}$$

Actual curve equation of the contact hole is achieved.

Next, as mentioned above, at the location where the tangent slope of the contiguous wall 132 is about tan 10°, the light leakage is acceptable, and the contrast of the liquid-crystal display is qualified. When the edge of the metal layer 120 extends to the critical point 136 (where the tangent slope of the contiguous wall 132 is about tan 10°), and the aperture ratio and the light transmittance (dark state contrast) are optimized. The equation of half of the second width of the metal layer along the first direction is:

$$\frac{\partial f(R')}{\partial R'}=\tan 10^\circ=0.176=\frac{\partial}{\partial R'}\left\{-h\cdot\exp\left[R'\cdot\frac{\ln(0.05)\cdot\tan(1.5\theta)}{0.95h}\right]\right\}$$

$$\Rightarrow -h\cdot\exp\left[R'\cdot\frac{\ln(0.05)\cdot\tan(1.5\theta)}{0.95h}\right]\cdot\frac{\partial}{\partial R'}\left[R'\cdot\frac{\ln(0.05)\cdot\tan(1.5\theta)}{0.95h}\right]=0.176$$

$$\Rightarrow \exp\left[R'\cdot\frac{\ln(0.05)\cdot\tan(1.5\theta)}{0.95h}\right]=\frac{-0.176\cdot 0.95}{\ln(0.05)\cdot\tan(1.5\theta)}$$

$$\Rightarrow R'\cdot\frac{\ln(0.05)\cdot\tan(1.5\theta)}{0.95h}=\ln\left[\frac{-0.1672}{\ln(0.05)\cdot\tan(1.5\theta)}\right]$$

$$\Rightarrow R'=\frac{0.95h}{\ln(0.05)\cdot\tan(1.5\theta)}\cdot\ln\left[\frac{-0.1672}{\ln(0.05)\cdot\tan(1.5\theta)}\right]$$

$$\Rightarrow R=R_0+\frac{0.95h}{\ln(0.05)\cdot\tan(1.5\theta)}\cdot\ln\left[\frac{-0.1672}{\ln(0.05)\cdot\tan(1.5\theta)}\right] \tag{7}$$

Considering that ±1.8 is acceptable manufacturing tolerance, when the first width and the second width satisfy the following equation, the aperture ratio and the light transmittance (dark state contrast) are optimized:

$$2*\left\{\frac{L_2}{2}+\frac{0.95h}{\ln(0.05)\cdot\tan(1.5\theta)}\cdot\ln\left[\frac{-0.1672}{\ln(0.05)\cdot\tan(1.5\theta)}\right]\right\}-1.8\leq$$

$$L_1\leq 2*\left\{\frac{L_2}{2}+\frac{0.95h}{\ln(0.05)\cdot\tan(1.5\theta)}\cdot\ln\left[\frac{-0.1672}{\ln(0.05)\cdot\tan(1.5\theta)}\right]\right\}+1.8$$

In one embodiment, the included angle θ is between 20~40 degrees, such as between 25~35 degrees.

With reference to FIG. 2, the element substrate 100 further comprises a conductive layer 140 disposed on the planarization layer 130, wherein the conductive layer 140 is electrically connected to the metal layer 120 via the contact hole 131. The conductive layer 140 is a made of transparent material or metal.

In one embodiment, the metal layer is a source electrode or a drain electrode of a driving element. In one embodiment, the element substrate 100 further comprises a semiconductor layer 137 located between the metal layer 120 and the substrate 110. The semiconductor layer 137 can be made of polycrystalline silicon, noncrystalline silicon or metal oxide.

Figure 3A:
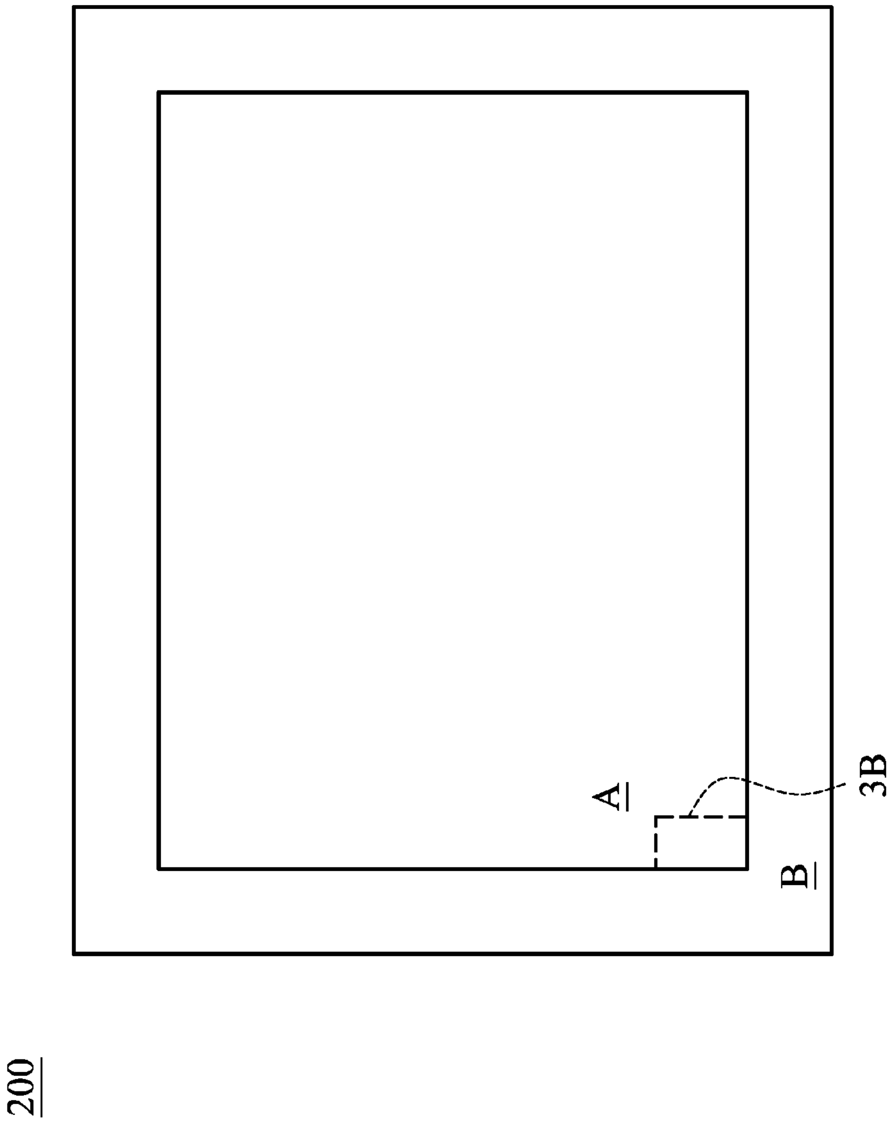
FIG. 3A shows the element substrate of the embodiment of the invention utilized in a liquid-crystal display.
Figure 3B:
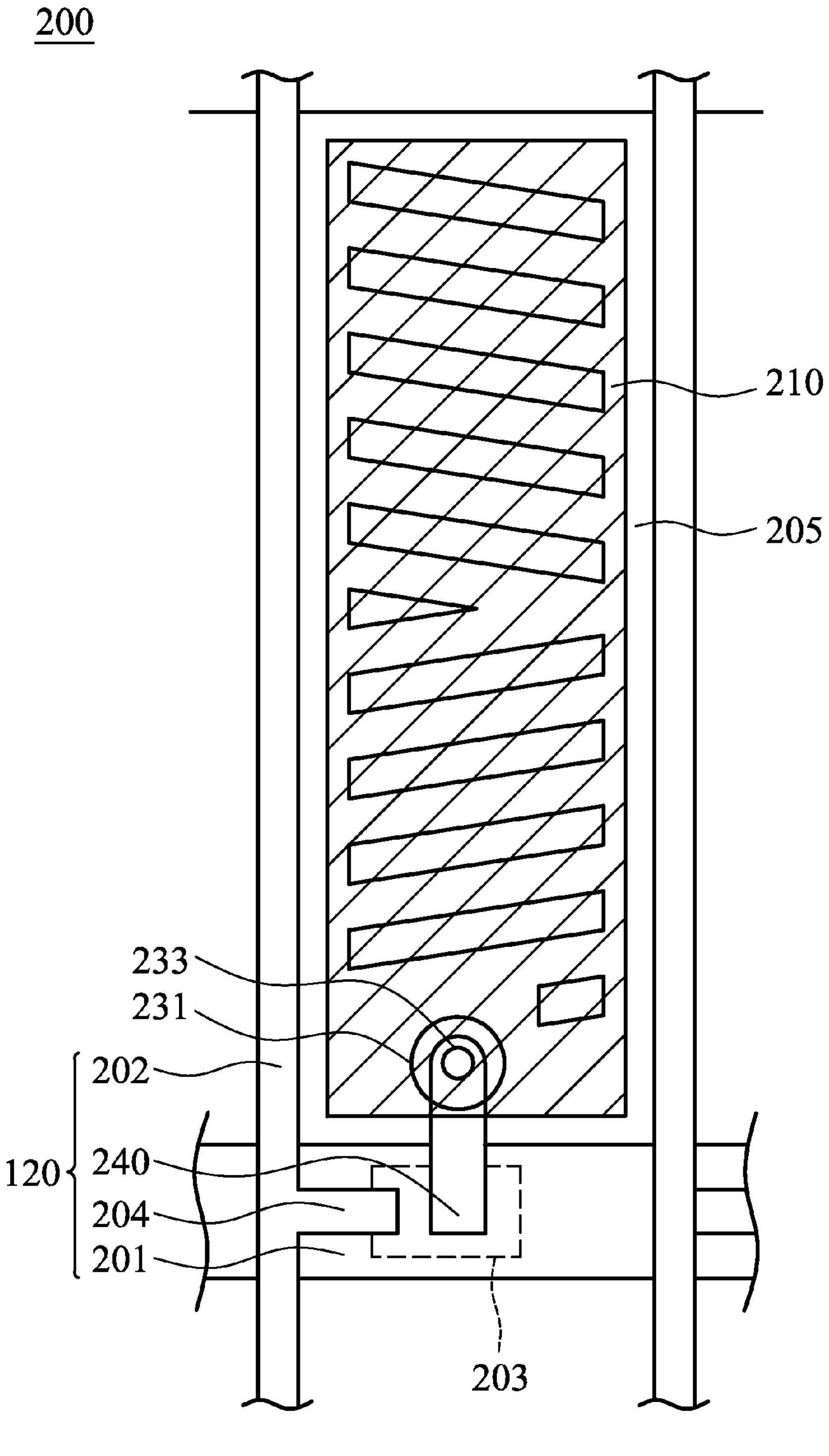
FIG. 3B shows the structure of portion 3B of FIG. 3A in detail.

FIG. 3A shows the element substrate of the embodiment of the invention utilized in a liquid-crystal display 200, which comprises a active area (pixel area) A and an non-active area (B). FIG. 3B shows detailed structures of portion 3B is FIG. 3A, wherein the liquid-crystal display 200 further comprises scan lines 201, data lines 202, a semiconductor layer 203, source electrodes 240, a contact hole 231, a bottom 233 of the contact hole, drain electrodes 204, common electrodes 205 and pixel electrodes 210, which are located in the active area A. In an embodiment of the invention, the metal layer 120 comprises the source electrodes 240, the drain electrodes 204, the scan lines 201 and the signal lines 202.

With reference to FIG. 2, in another embodiment, the metal 120 comprises a first edge 121 along the first direction X, the first edge 121 vertically corresponds to a critical point 136 which is on the contiguous wall 132, and the tangent slope of the contiguous wall 132 at the critical point 136 is less than tan 10° (0.176). The base point 135 is located at the point where the contiguous wall 132 is connected to the bottom 133. The straight line L connects a reference point 134 and a base point 135. An included angle θ is between a straight line L and a horizontal line, and the included angle θ is between 20~40 degrees, such as 25~35 degrees. The metal layer 120 has a first width L1 along the first direction X, and the bottom 133 of the contact hole 131 has a second width L2 along the first direction X, wherein the first width and the second width satisfy the following equation:

$$2*\left\{\frac{L_2}{2}+\frac{(1-p)h}{\ln(p)\cdot\tan(1.5\theta)}\cdot\ln\left[\frac{-0.176*(1-p)}{\ln(p)\cdot\tan(1.5\theta)}\right]\right\}=L_1$$

L1 is the first width of the metal layer 120 along the first direction X, and L2 is the second width of the bottom 133 of the contact hole 131 along the first direction X, and p is an adjustable parameter, and (1−p)h is a height of the reference point in a vertical direction, and $0<p\leq 0.1$, such as $0<p\leq 0.05$. By modifying the parameters above, the curvature and the shape of the contiguous wall 132 can be modified.

Figure 4:
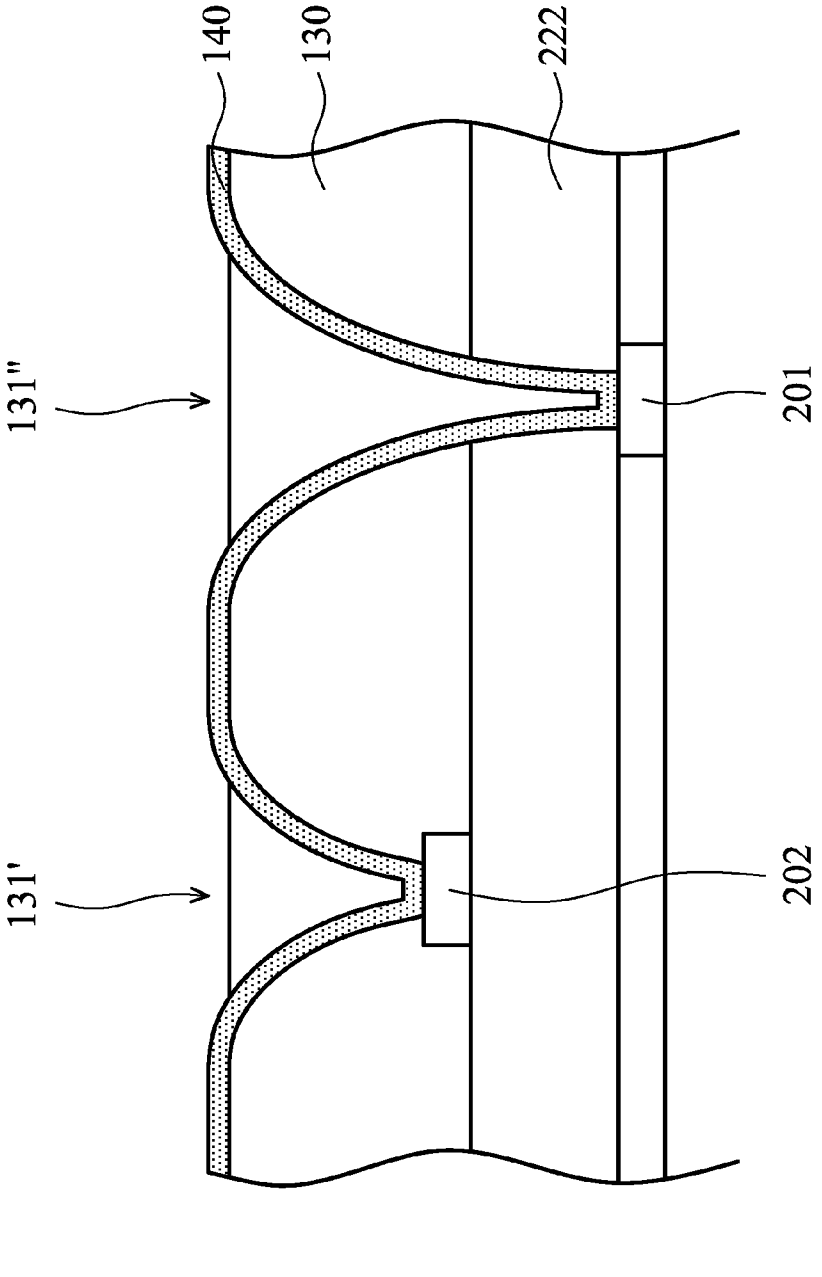
FIG. 4 shows an element substrate of a modified embodiment of the invention.

In the embodiments above, the contact hole is in the active area (pixel area) A. However, the invention is not limited thereby. The contact hole structure of the embodiment of the invention can also be located in non-active area B. With reference to FIG. 4, in one embodiment, the conductive layer 140 in the contact hole 131' is connected to the data line 202, and the relationship between the profile of the contact hole 131' and the width of the data line 202 can satisfy the above equations. The contact hole 131' is connected to the scan line 201 via the contact hole 131" on the planarization layer 130 and the gate insulation layer 222. The relationship between the profile of the contact hole 131" and the width of the scan line 201 can satisfy the above equations. In this embodiment, the gate insulation layer 222 is formed between the data line 202 and the scan line 201.

Figure 5:
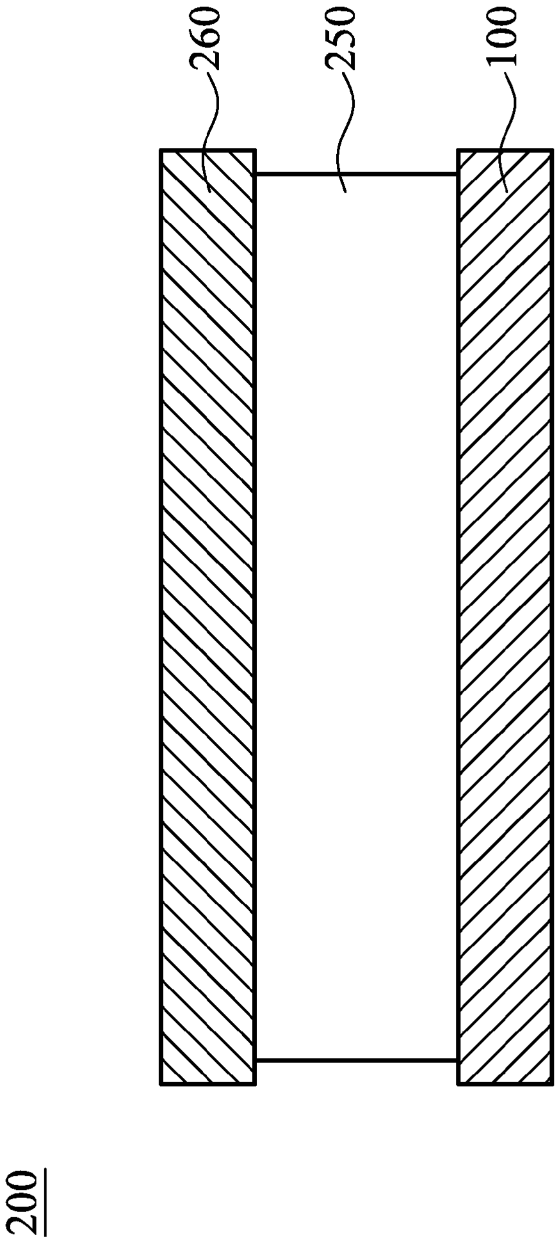
FIG. 5 shows a liquid-crystal display of an embodiment of the invention.

FIG. 5 shows a liquid-crystal display 200 of an embodiment of the invention, which comprises an opposite substrate 260, a liquid-crystal layer 250 and the element substrate 100.

Figure 6:
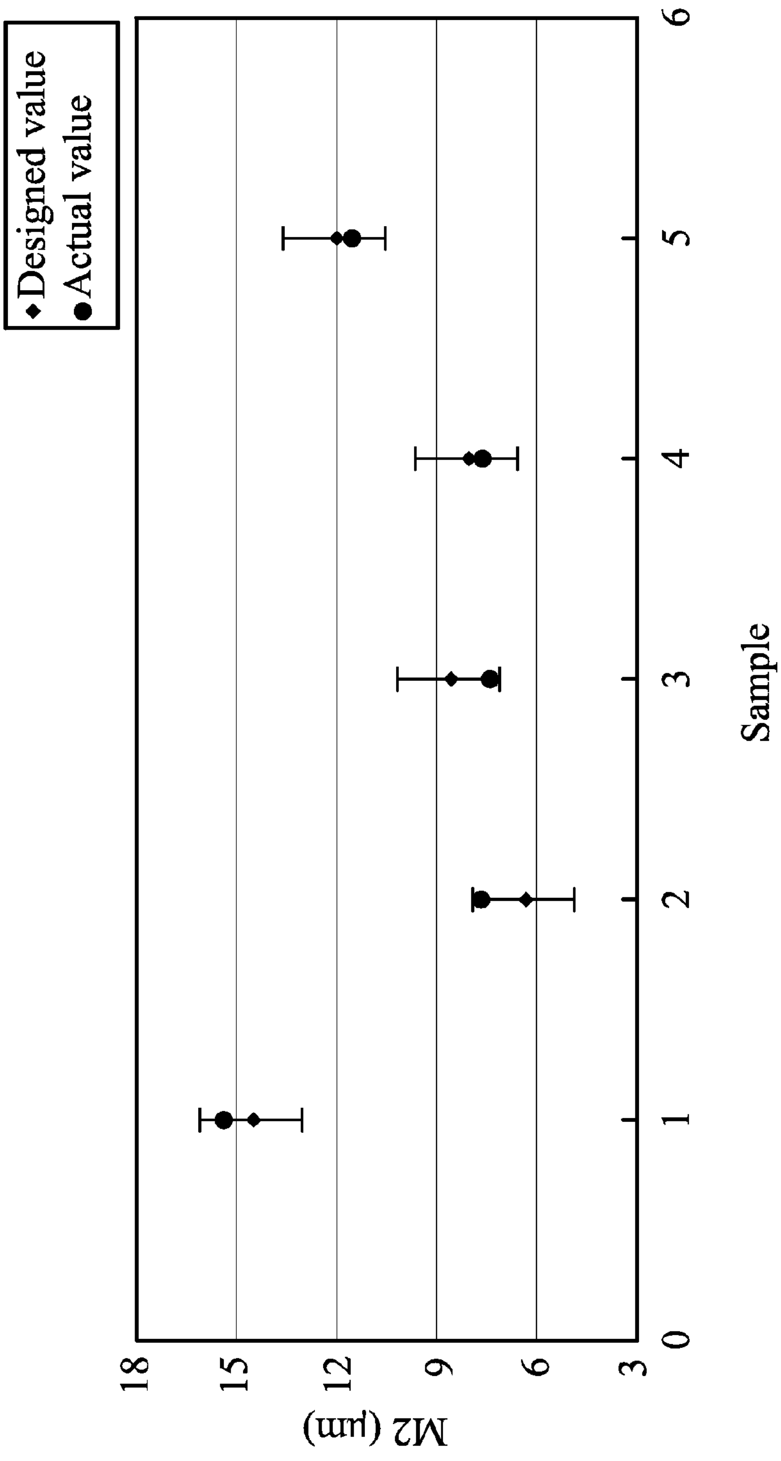
FIG. 6 shows the designed width and the actual width of the metal layer.

With reference to Table 1 and FIG. 6, in the embodiment of the invention, the width of the metal layer (M2) 120 has tolerance of ±1.8.

TABLE 1

| | Sample 1 | Sample 2 | Sample 3 | Sample 4 | Sample 5 |
|---|---|---|---|---|---|
| Designed width of the metal layer (M2) | 14.54 | 6.42 | 8.69 | 8.12 | 12.07 |
| Actual width of the metal layer (M2) 120 | 15.37 | 7.66 | 7.41 | 7.79 | 11.52 |
| tolerance | 0.83 | 1.24 | −1.28 | −0.33 | −0.55 |

Utilizing the embodiment of the invention, the aperture ratio and the light transmittance (dark state contrast) of the liquid-crystal display are optimized, and the light leakage and the low-contrast problem are prevented.

Use of ordinal terms such as “first”, “second”, “third”, etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An element substrate, comprising:

a substrate;

a metal layer, disposed on the substrate and having a first width along a first direction; and a planarization layer, disposed on the metal layer and having a first thickness along a second direction perpendicular to the first direction, wherein the planarization layer comprises a top and a bottom, and the first thickness is a distance between the top and the bottom along the second direction, wherein the planarization layer comprises a contact hole, the contact hole has a contiguous wall and a hole bottom, the hole bottom exposes the metal layer, and the hole bottom has a second width along the first direction, wherein the first width and the second width satisfy the following equation:

$$2*\left\{\frac{L_2}{2}+\frac{(1-p)h}{\ln(p)\cdot\tan(1.5\theta)}\cdot\ln\left[\frac{-0.176*(1-p)}{\ln(p)\cdot\tan(1.5\theta)}\right]\right\}-1.8\leq L_1\leq 2*\left\{\frac{L_2}{2}+\frac{(1-p)h}{\ln(p)\cdot\tan(1.5\theta)}\cdot\ln\left[\frac{-0.176*(1-p)}{\ln(p)\cdot\tan(1.5\theta)}\right]\right\}+1.8$$

wherein L1 is the first width, L2 is the second width, h is the first thickness, θ is an included angle between a straight line and an extension surface of the hole bottom, the straight line connects a reference point and a base point, the reference point and the base point are located on the contiguous wall, wherein a distance from the reference point to the bottom of the planarization layer along the second direction is 0.95 h, the base point is located at the point where the contiguous wall is connected to the hole bottom, p is an adjustable parameter, and 0<p≤0.1.

2. The element substrate as claimed in claim 1, wherein the adjustable parameter p is 0.05.

3. The element substrate as claimed in claim 1, wherein the included angle θ is between 20 and 40 degrees.

4. The element substrate as claimed in claim 1, wherein the included angle θ is between 25 and 35 degrees.

5. The element substrate as claimed in claim 1, further comprising a conductive layer disposed on the planarization layer, wherein the conductive layer is electrically connected to the metal layer via the contact hole.

6. The element substrate as claimed in claim 1, wherein the metal layer is a source electrode or a drain electrode of a driving element.

7. The element substrate as claimed in claim 1, wherein the metal layer is a data line or a scan line of a driving element.

8. The element substrate as claimed in claim 5, wherein the conductive layer is a made of transparent material.

9. The element substrate as claimed in claim 1, further comprising a semiconductor layer located between the metal layer and the substrate.

10. The element substrate as claimed in claim 9, wherein the semiconductor layer is made of polycrystalline silicon, noncrystalline silicon or metal oxide.

11. The element substrate as claimed in claim 5, wherein the conductive layer is made of metal.

12. A liquid-crystal display, comprising:

an opposite substrate;

an element substrate, facing the opposite substrate;

a liquid-crystal layer disposed between the opposite substrate and the element substrate, wherein the element substrate comprises:

a metal layer, disposed on the substrate and having a first width along a first direction; and a planarization layer, disposed on the metal layer and having a first thickness along a second direction perpendicular to the first direction, wherein the planarization layer comprises a top and a bottom, and the first thickness is a distance between the top and the bottom along the second direction, wherein the planarization layer comprises a contact hole, the contact hole has a contiguous wall and a hole bottom, the hole bottom exposes the metal layer, and the hole bottom has a second width along the first direction, wherein the first width and the second width satisfy the following equation:

$$2*\left\{\frac{L_2}{2}+\frac{(1-p)h}{\ln(p)\cdot\tan(1.5\theta)}\cdot\ln\left[\frac{-0.176*(1-p)}{\ln(p)\cdot\tan(1.5\theta)}\right]\right\}-1.8\leq L_1\leq 2*\left\{\frac{L_2}{2}+\frac{(1-p)h}{\ln(p)\cdot\tan(1.5\theta)}\cdot\ln\left[\frac{-0.176*(1-p)}{\ln(p)\cdot\tan(1.5\theta)}\right]\right\}+1.8$$

wherein L1 is the first width, L2 is the second width, h is the first thickness, θ is an included angle between a straight line and an extension surface of the hole bottom, the straight line connects a reference point and a base point, the reference point and the base point are located on the contiguous wall, wherein a vertical distance from the reference point to the bottom of the planarization layer along the second direction is 0.95 h, the base point is located at the point where the contiguous wall is connected to the hole bottom, p is an adjustable parameter, and 0<p≤0.1.

13. The liquid-crystal display as claimed in claim 12, wherein the adjustable parameter p is 0.05.

14. The liquid-crystal display as claimed in claim 12, wherein the included angle θ is between 20 and 40 degrees.

15. The liquid-crystal display as claimed in claim 12, wherein the included angle θ is between 25 and 35 degrees.

16. The liquid-crystal display as claimed in claim 12, further comprising a conductive layer disposed on the planarization layer, wherein the conductive layer is electrically connected to the metal layer via the contact hole.

17. The liquid-crystal display as claimed in claim 12, further comprising a semiconductor layer located between the metal layer and the substrate.

18. The liquid-crystal display as claimed in claim 17, wherein the semiconductor layer is made of polycrystalline silicon, noncrystalline silicon or metal oxide.

* * * * *